United States Patent [19]

Haferl

[11] 4,338,549
[45] Jul. 6, 1982

[54] VERTICAL DEFLECTION CIRCUIT

[75] Inventor: Peter E. Haferl, Adliswil, Switzerland

[73] Assignee: RCA Corporation, New York, N.Y.

[21] Appl. No.: 237,848

[22] Filed: Feb. 24, 1981

[30] Foreign Application Priority Data

Mar. 20, 1980 [GB] United Kingdom ............... 8009402

[51] Int. Cl.³ .............................................. H01J 29/72
[52] U.S. Cl. ..................................... 315/393; 315/408
[58] Field of Search .................. 315/399, 408, 410, 393

[56] References Cited

U.S. PATENT DOCUMENTS

| 4,048,544 | 9/1977 | Haferl | 315/408 |
| 4,096,415 | 6/1978 | Haferl | 315/393 |
| 4,157,487 | 6/1979 | Riechmann | 315/393 |
| 4,174,493 | 11/1979 | Dobbert et al. | 315/408 |
| 4,234,826 | 11/1980 | Dietz | 315/393 |
| 4,238,712 | 12/1980 | Dietz | 315/393 |

FOREIGN PATENT DOCUMENTS 47-18425 9/1972 Japan .

Primary Examiner—Theodore M. Blum
Attorney, Agent, or Firm—E. M. Whitacre; P. J. Rasmussen; S. J. Stevens

[57] ABSTRACT

A synchronous switched vertical deflection circuit for use with a television receiver comprises first and second bidirectional switches coupled to conduct current in opposite directions. Horizontal rate energy is coupled into one end of the switches. Vertical deflection means are connected to the other end of the switches. Pulse-width modulated signals are applied to the control terminals of the switches to allow conduction of the horizontal rate energy in the vertical deflection means during selected portions of each vertical deflection interval.

11 Claims, 10 Drawing Figures

Fig. 7
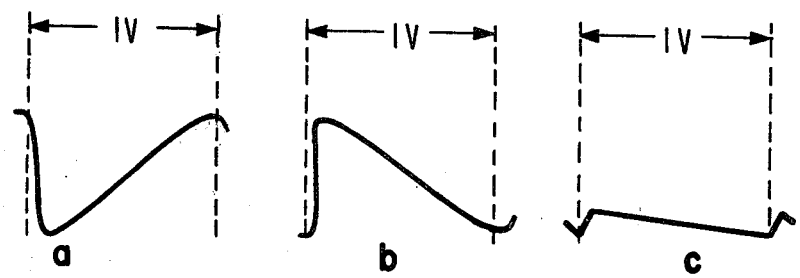
Fig. 8
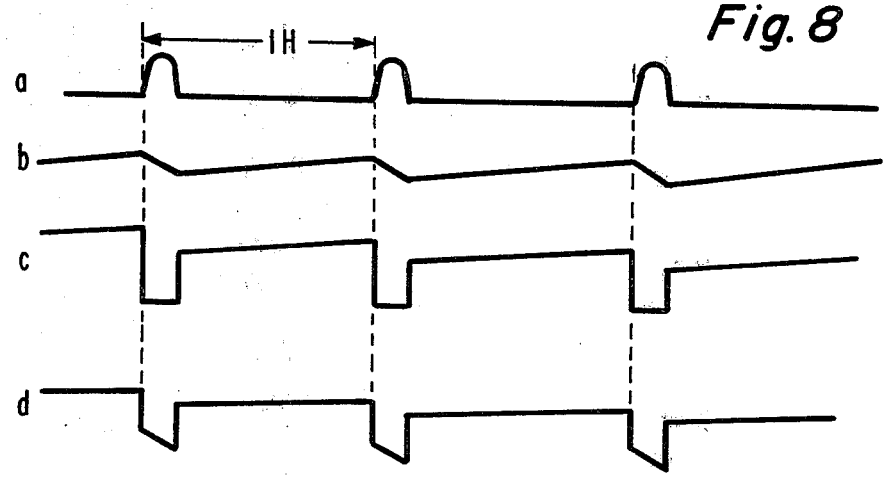
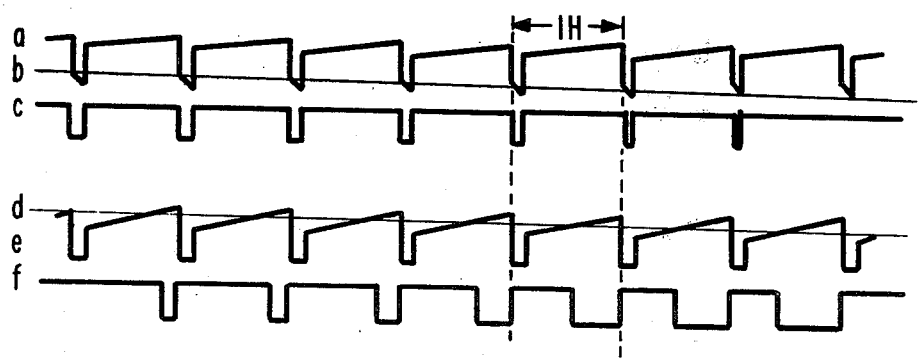
Fig. 9

VERTICAL DEFLECTION CIRCUIT

This invention relates to vertical deflection circuits for color television receivers, and in particular, to synchronous switched vertical deflection circuits which derive vertical deflection power from the horizontal deflection energy.

A color television receiver operates by scanning a plurality of electron beams horizontally and vertically across a display screen on which are deposited dots or stripes of color-emitting phosphors. Each electron beam desirably strikes only a particular color-emitting phosphor, so that each electron beam may be designated by a single color. An image is produced on the phosphor display screen by modulating the intensity of the electron beams with particular components of the video signal corresponding to the desired level of color for each electron beam designated color.

The scanning of the electron beams is accomplished by a deflection yoke having coils of wire which are energized with the deflection signals and develop time-variant magnetic fields in the vicinity of the electron beams. These magnetic fields deflect the beams to form the desired scanned raster. The horizontal deflection circuitry generates a deflection signal which deflects the electron beams at a high frequency line rate (15,734 kHz in the U.S.). Retrace of the beams after each scanned line occurs in only a few microseconds. This rapid signal switching requires a substantial amount of energy.

Conventional vertical deflection circuits utilize an oscillator to generate a field rate (60 Hz in the U.S.) signal. The oscillator output drives a waveform generator which produces a vertical deflection sawtooth waveform, which in turn drives a vertical deflection amplifier. Although vertical deflection requires less power than horizontal deflection, it still remains a significant factor in the overall power consumption of the receiver.

The synchronous switched vertical deflection (SSVD) system accomplishes a reduction in receiver power consumption by deriving the vertical deflection power from the available horizontal deflection energy, such as described in U.S. Pat. No. 4,048,544—Haferl. In the SSVD system, a capacitor is charged by the rectified horizontal retrace pulses. The vertical yoke windings are connected in parallel with this capacitor and provide a discharge path for the capacitor so that the discharge current becomes the vertical deflection current. In one particular system, the capacitor is charged positively during the first half of vertical trace and negatively during the second half of vertical trace by the operation of a pair of SCR's. The amount of charge placed on the capacitor by any particular horizontal pulse is determined by a modulator associated with each SCR. The modulators control the time of turn-on or conduction of each SCR. The conduction time of one SCR is progressively shortened during the first half of vertical trace while the conduction time of the other SCR is progressively increased during the second half of vertical trace. The horizontal rate energy is integrated into a vertical rate sawtooth voltage across the capacitor and this charge is discharged by the yoke winding to provide the desired vertical deflection scanning current.

Prior art SSVD systems utilized separate modulators for each SCR and a separate or floating winding on the high voltage transformer to control one of the SCR's. These requirements increase the complexity and cost of the vertical deflection current.

The present invention provides an SSVD circuit which does not require a floating winding on the high voltage transformer and which operates both SCR's from a single modulator through a common gate drive arrangement.

In accordance with the invention, a vertical deflection circuit for use in a television receiver comprises first and second bidirectional switches. Each of the switches comprises a controllable switch element and a control terminal electrically coupled to the controllable switch element. The first and second switches are connected in series with the controllable switch elements coupled to conduct current in opposite directions through the switches.

A source of horizontal deflection rate energy is coupled to one end of the bidirectional switches. Vertical deflection means including a vertical deflection coil are coupled to the other end of the switches.

A source of pulse-width modulated signals is coupled to the control terminals of the switches in order to control the conductivity of the controllable switch elements in such a manner as to permit conduction of the horizontal rate energy through the switches and into the vertical deflection means for a predetermined duration of each vertical deflection interval.

In the accompanying drawing,

FIGS. 7a-7c illustrate signal waveforms useful in understanding the operation of the error amplifier portion of the circuit shown in FIG. 6;

FIGS. 8a-8d and 9a-9f illustrate signal waveforms useful in understanding the operation of the pulse width modulator of FIG. 6.

Figure 1:
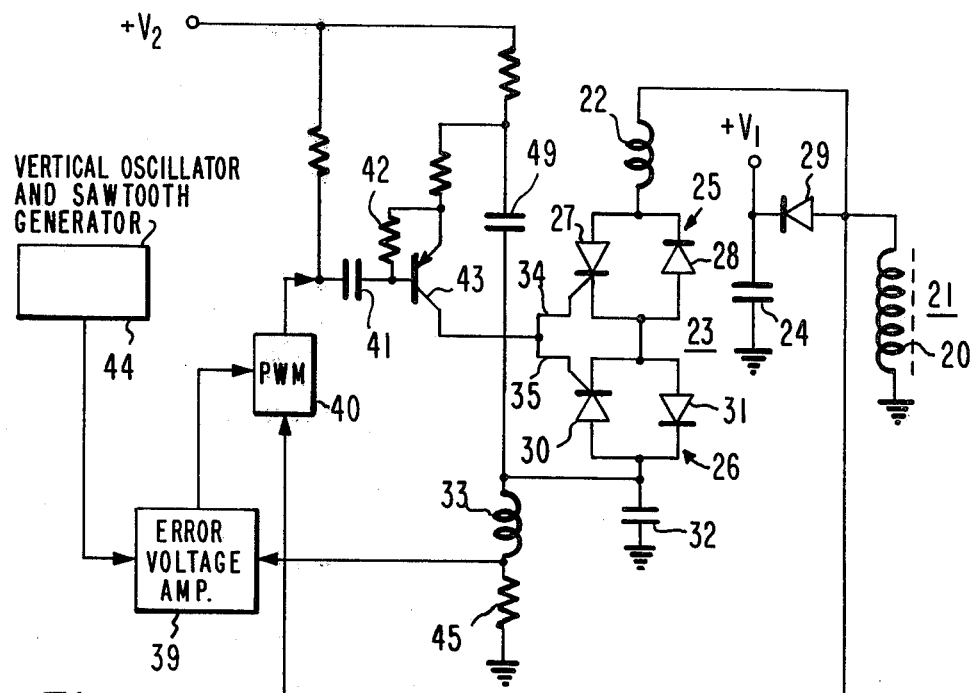
FIG. 1 is a diagram in block and schematic form of a vertical deflection circuit in accordance with the present invention.

FIG. 1 shows the basic elements of a synchronous switched vertical deflection system in accordance with the present invention. A winding 20 of a high voltage transformer 21 supplies horizontal rate trace and retrace pulses (shown as the waveform in FIG. 2a) through an input choke 22 from a horizontal deflection circuit (not shown) to one end of a current switching assembly 23. The output from winding 20 of transformer 21 is also rectified by diode 29 and filtered by capacitor 24 to provide B+ voltage at terminal $+V_1$ for other receiver circuits.

Switching assembly 23 comprises a pair of bidirectional switches 25 and 26 connected in series. In FIG. 1, bidirectional switches 25 and 26 are shown as integrated thyristor rectifiers (ITR's). Each of the bidirectional switches (hereinafter referred to as ITR's) 25 and 26 incorporates an SCR and a diode. ITR 25 includes SCR 27 and diode 28, and ITR 26 includes SCR 30 and diode 31. The SCR and diode of each ITR are poled to conduct current in opposite directions. Switching assembly 23 is constructed such that the cathodes of SCR's 27 and 30 are connected together. Two current paths are, therefore, provided through switching assembly 23. One path is through SCR 27 of ITR 25 and diode 31 of ITR 26. The other path is through SCR 30 of ITR 26 and diode 28 of ITR 25. The actual current path is determined by which of SCR's 27 and 30 is rendered conductive at any given point in time.

As previously described, one end of switching assembly 23 is connected to a source of horizontal rate deflection pulses. The other end of switching assembly 23 is connected to the parallel combination of a capacitor 32 and the vertical yoke winding 33. Horizontal rate current conducted through switching assembly 23 charges capacitor 32 which integrates the horizontal energy to form a vertical rate sawtooth voltage. The voltage on capacitor 32 is then applied to winding 33 to develop the necessary yoke current for deflection of the electron beams. The amount of beam deflection at any given instant is, therefore, dependent on the charge on capacitor 32, which in turn is dependent upon the amount of current conducted through switching assembly 23.

Figure 2:
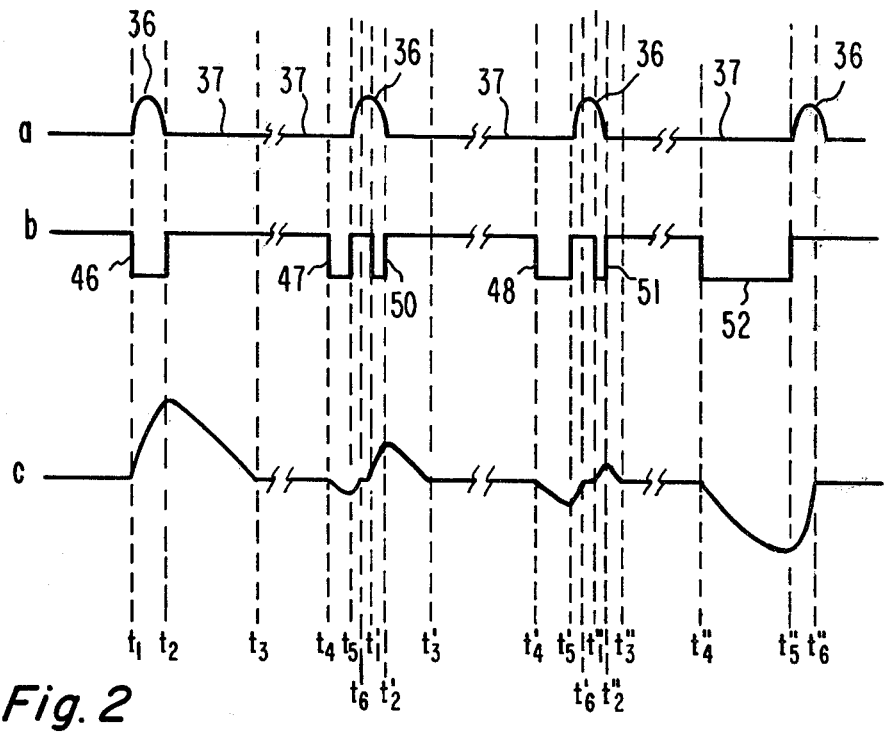
FIGS. 2a-2c are signal waveforms taken at various times during a vertical scan interval at selected locations of the circuit shown in FIG. 1.

The conduction of ITR's 25 and 26 is controlled by SCR's 27 and 30 via gate inputs 34 and 35. Since conduction enabling gate pulses are provided from a single source to parallel-connected gate inputs 34 and 35, the gate pulses will appear at the gate terminals or electrodes of both SCR's 27 and 30 simultaneously. The SCR that is gated into conduction will be determined by the polarity of the horizontal rate pulses applied to switching assembly 23, since either SCR will conduct only if its anode to cathode voltage is positive. The horizontal rate pulse waveform, shown in FIG. 2a, provides retrace pulse portions 36 having a positive polarity, and trace pulse portions 37 having a negative polarity. Therefore, SCR 27 may be rendered conductive by a gate pulse during a horizontal retrace interval, and SCR 30 may be rendered conductive by a gate pulse present during a horizontal trace interval.

In order to provide an appropriate vertical deflection voltage to winding 33, the timing of the gate pulses to SCR's 27 and 30 must be precisely controlled. These gate pulses are generated from modulator pulses produced by a pulse width modulator 40. Portions of the modulator pulse waveform are shown in FIG. 2b. Each modulator pulse is differentiated by the combination of a capacitor 41, a resistor 42 and the base-emitter junction diode of a gate driver transistor 43, such that each negative-going modulator pulse transient produces pulse through transistor 43 to the gates of SCR's 27 and 30. Switching assembly 23 is referenced to ground potential through yoke winding 33. Therefore, the reference potential across SCR's 27 and 30 with respect to ground will be dependent on the yoke voltage, which is constantly changing. In order to properly gate SCR's 27 and 30, it is necessary to also reference the gate drive circuit to the yoke voltage. This is done by biasing gate driver transistor 43 with respect to the vertical yoke voltage by a capacitor 49. Capacitor 49 acts as a supply battery for transistor 43. Capacitor 49 is charged from supply voltage $V_2$ to approximately 15 volts and maintains proper supply and bias levels for transistor 43 regardless of the yoke voltage. Therefore, even though the gates of SCR's 27 and 30 float on the yoke voltage, the gate drive circuit also floats on the yoke voltage to provide proper gate drive levels to trigger SCR's 27 and 30 from a single gate pulse source.

Pulse width modulator 40 produces modulator pulses based on a vertical rate error voltage provided by an error voltage amplifier 39 and horizontal rate pulses from winding 20 of transformer 21. The modulator pulses are formed in a manner which will be described later. The error voltage produced by error voltage amplifier 39 is derived from vertical deflection signals generated by a vertical oscillator and sawtooth generator 44 and a vertical deflection signal feedback from a yoke sampling resistor 45.

FIG. 2a illustrates the horizontal rate pulse waveform at selected times during a vertical deflection interval. Associated modulator pulses which are produced at these times are shown in FIG. 2b. The first horizontal rate signal sample is taken near the beginning of vertical trace. The modulator pulse 46 shown in FIG. 2b occurs only during the horizontal retrace interval and has a duration almost equal to the duration of the horizontal retrace pulse. The second and third horizontal rate signal samples are taken, respectively, shortly after the center of vertical trace. FIG. 2b shows that modulator pulses 47 and 48 occur during the horizontal trace interval and modulator pulses 50 and 51 occur during the horizontal retrace interval. It can be seen that the modulator pulses which occur during the horizontal retrace intervals have progressively shorter durations during the course of vertical scan. The fourth horizontal rate signal sample is taken near the end of the vertical scan period. Associated modulator pulse 52 occurs only during the horizontal trace interval. It can be seen that the modulator pulses which occur during the horizontal trace intervals have progressively longer duration during the course of vertical scan.

FIG. 2c illustrates current flow through ITR's 25 and 26 in response to the modulator of FIG. 2b. The positive-going signal components represent current flow through ITR 25 when SCR 27 conducts. Negative-going signal components represent current through ITR 26 when SCR 30 conducts. At time $t_1$, modulator pulse 46 is applied to transistor 43 which supplies a gate pulse via gate inputs 34 and 35 to the gates of SCR's 27 and 30. Positive-going retrace pulse 36, present at the anode of SCR 27, forward biases SCR 27, causing it to be gated into conduction by the gate pulse generated from modulator pulse 46. Current increases until time $t_2$, the beginning of the next horizontal trace interval, when the anode-cathode voltage of SCR 27 is reversed. Energy stored in inductor 22 maintains SCR 27 in conduction until time $t_3$. During each succeeding horizontal retrace interval, the modulator pulse will be progressively shorter in duration, causing SCR 27 to conduct for a progressively shorter length of time. Capacitor 32, therefore, charges to a progressively lower voltage, which provides less beam deflection, and acts to bring the beam down toward the center of the screen.

At some time before the center of vertical scan, modulator pulses such as pulse 47 occur during a horizontal trace interval. Gate drive transistor 43 generates a gating signal which is applied to the gates of SCR's 27 and 30. The negative horizontal trace pulse from winding 20 causes the anode-cathode voltage of SCR 30 to be positive, thereby causing SCR 30 to be gated into conduction by the gate pulse generated from modulator pulse 47. Current flow through SCR 30 causes capacitor 32 to charge negatively from ground, which supplies a negative voltage to vertical yoke winding 33. At time $t_5$, the occurrence of a horizontal retrace pulse 36 reverses the anode-cathode voltage of SCR 30, causing the current flow through SCR 30 to rapidly decay.

At some time $t_1'$ during the horizontal interval following $t_5$, a modulator pulse 50 is generated which, via transistor 43, renders SCR 27 conductive in a manner previously described. Capacitor 32 charges positively with respect to ground, supplying a positive voltage to yoke winding 33. Capacitor 32 integrates the individual horizontal rate pulses to provide a smooth vertical rate sawtooth voltage across capacitor 32 which in turn drives a vertical rate sawtooth deflection current through winding 33 for electron beam deflection. As can be seen in FIG. 2c, positive and negative charging currents for capacitor 32 overlap on either side of the center of vertical trace. Prior to the center of vertical scan, the net ITR current is positive, as can be seen in the second horizontal rate signal sample of FIG. 2c. Hence, the net yoke voltage is positive. Shortly, after the center of vertical scan, the net ITR current is negative, as shown in the third signal sample of FIG. 2c, resulting in a net negative yoke voltage. The sawtooth voltage is established by the net current so that there is a smooth transition from positive to negative scanning current at the center of trace.

Near the end of vertical scan, modulator pulses only occur during the horizontal trace intervals, as shown in the fourth signal sample of FIG. 2b. Modulator pulse 52 causes SCR 30 to conduct at time $t_4''$ until time $t_6''$. The resultant negative voltage supplied to yoke winding 33 causes the electron beam or beams to be deflected toward the bottom of the screen. Vertical retrace of the beams is provided via conduction of SCR 27 during the vertical retrace interval resulting from modulator pulses which occur only during the horizontal retrace intervals. This provides a positive charging current for capacitor 32 during this period, with the maximum current being developed at $t_1$, the start of the next vertical scan interval.

For a given amount of beam deflection, i.e., yoke voltage, SCR 30 conducts for a longer time than does SCR 27. This is necessary since the horizontal trace pulse voltage is of a lower amplitude than the horizontal retrace pulse voltage. In order to charge capacitor 32 to the same voltage level, a longer conduction period of SCR 30 than SCR 27 is needed.

Figure 3:
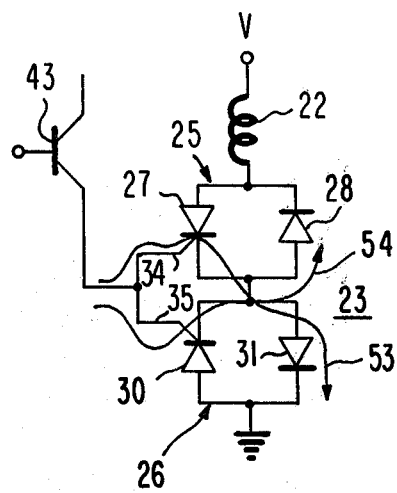
FIG. 3 illustrates the operation of the current switching elements shown in FIG. 1.

FIG. 3 illustrates the controllable gate current paths through ITR's 25 and 26. Controllable current path 53 shows that gate current passes through diode 31 of ITR 26 when SCR 27 of ITR 25 is rendered conductive. Alternately, controllable current path 54 shows that gate current passed through diode 28 of ITR 25 when SCR 30 of ITR 26 is rendered conductive.

Figure 4:
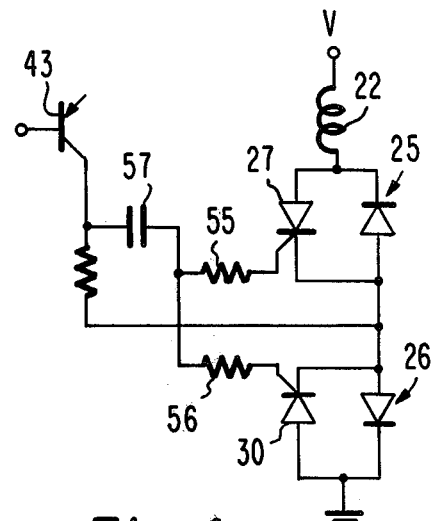
FIG. 4 is a schematic diagram of a particular embodiment of a portion of the circuit shown in FIG. 1.

FIG. 4 shows a practical embodiment of a circuit for driving the gates of SCR's 27 and 30. For simplicity, the remainder of the deflection circuit has been omitted. Resistors 55 and 56 are used to equalize any differences between the gate trigger voltages of ITR 25 and ITR 26. Capacitor 57 reduces the turn off time of SCR 27 and SCR 30 because of negative gate voltage supplied by capacitor 57.

Figure 5A:
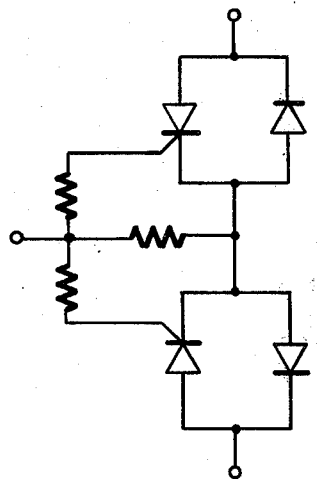
FIGS. 5a-5b illustrate two embodiments for the integration of the switching elements of FIG. 1.
Figure 5B:
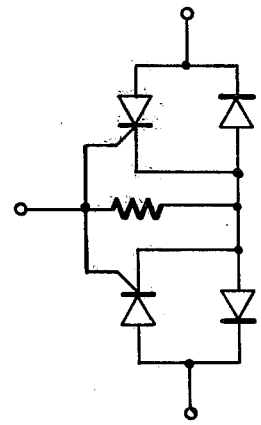

FIGS. 5a and 5b illustrate alternate ways in which two ITR's may be integrated into one package. The embodiment of FIG. 5b eliminates the gate input resistors.

Figure 6:
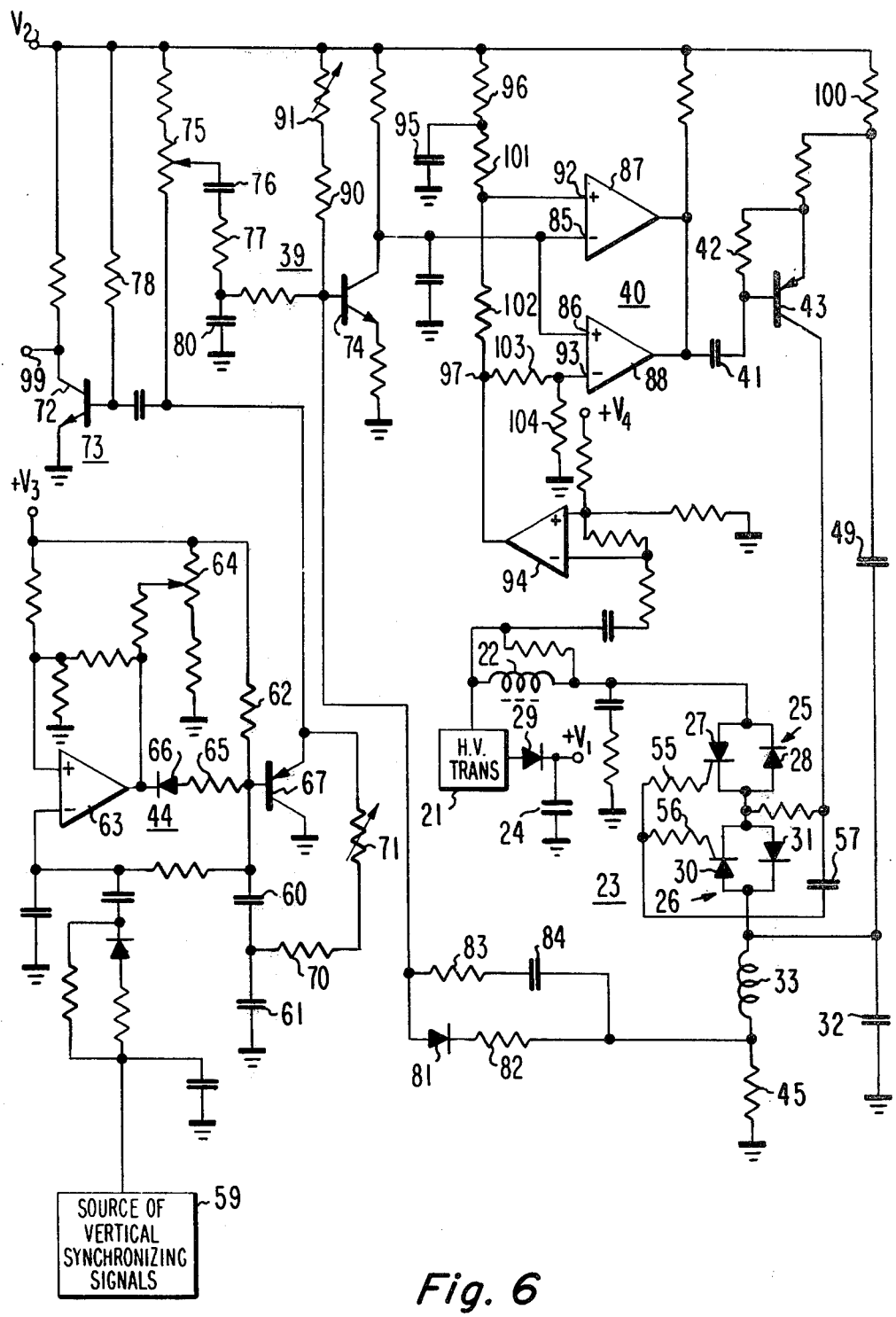
FIG. 6 is a schematic diagram of one embodiment of a vertical deflection circuit in accordance with the present invention.

Referring to FIG. 6, there is shown a detailed embodiment of a synchronous switched vertical deflection circuit in accordance with the present invention. Circuit components previously described with reference to FIG. 1 are identified by the same reference numeral. By reference to the waveforms illustrated in FIGS. 7, 8 and 9, the operation of the vertical deflection circuit shown in FIG. 6 will now be described.

The vertical oscillator and sawtooth generator 44 comprises a source 59 of vertical synchronizing signals coupled to a comparator 63.

Capacitors 60 and 61 of vertical oscillator and sawtooth generator 44 charge via resistor 62 from the $+V_3$ supply to provide a ramp voltage at the upper terminal of capacitor 60. Comparator 63 compares the ramp voltage on capacitors 60 and 61 at one input to a DC voltage level at the other input. This DC voltage level is adjustable by potentiometer 64, which operates as a vertical hold control. When the ramp voltage level on capacitors 60 and 61 reaches the DC voltage level, the output of comparator 63 is rendered conductive and discharges capacitors 60 and 61 via resistor 65 and diode 66 to form a vertical rate sawtooth voltage at the base of transistor 67. During conduction of comparator 63, the DC voltage level is switched low, to provide a reference for the voltage on discharging capacitors 60 and 61. When the capacitor voltage reaches the DC voltage level, comparator 63 is again rendered nonconductive and the DC voltage level returns to the value determined by potentiometer 64 and a new charge cycle is initiated. Sync signal source 59 provides the vertical sync signals to the ramp voltage input of comparator 63 to synchronizing operation of the circuit by triggering comparator 63 into conduction at the appropriate time. The sawtooth voltage at the emitter of transistor 67 is fed back to the junction between ramp capacitors 60 and 61 via resistor 70 and variable resistor 71 to provide linearity correction of the sawtooth signal, by a positive bending of the sawtooth voltage at the beginning of trace.

The output of the oscillator and sawtooth generator circuit 44 (emitter of transistor 67) is coupled to the base of a transistor 72, which comprises part of a blanking circuit 73. Blanking circuit 73 provides a negative-going blanking pulse of approximately 1.2 milliseconds in duration during vertical retrace at output terminal 99. The width of the blanking pulse is determined by the value of resistor 78.

A transistor 74 comprises part of error voltage amplifier 39. The voltage difference between the inputs of transistor 74 represents an error voltage. This voltage is amplified by transistor 74 and applied to modulator circuit 40 via inputs 85 and 86 of comparators 87 and 88 respectively. The average DC collector voltage of transistor 74 is determined by the value of resistor 90 and variable resistor 91 which form a centering control.

The positive-going sawtooth voltage output of the vertical oscillator and sawtooth generator 44 is applied to the base of transistor 74 via height control potentiometer 75, S-shaping capacitor 76, and a smoothing network comprising resistor 77 and capacitor 80. This sawtooth signal is shown in FIG. 7a. The negative-going sawtooth voltage across yoke sampling resistor 45, shown in FIG. 7b, is also coupled to the base of transistor 74 via diode 81 and resistor 82 and an enhancing network comprising resistor 83 and capacitor 84 which, along with resistor 77 and capacitor 80, equalize the retrace slopes of the sawtooth voltages fed to transistor 74 so that the error voltage will not have any wide voltage swings during retrace, which could lead to unwanted triggering of ITR's 25 and 26. Diode 81 compensates transistor 74 for variations in ambient temperature. The amplified error voltage at the collector of transistor 74, as shown in FIG. 7c, is with reference to the particular application of FIG. 6 a negative-going signal having maximum deviations from a DC offset value at the beginning and end of vertical trace. A negative-going error signal is necessary in the context of FIG. 6 in order to provide proper operation of the modulator 40.

Comparators 87 and 88 of pulse width modulator 40 operate as voltage comparators. Comparator 87 compares the error voltage applied to input terminal 85 with a negative-going horizontal retrace ramp applied to input terminal 92. Comparator 88 compares the error voltage at input terminal 86 with a positive-going horizontal trace ramp at input terminal 93. The horizontal trace and retrace ramp voltages are formed in the following manner. Comparator or ramp switch 94 has one input terminal connected to transformer 21, which supplies ramp switch 94 with horizontal retrace pulses having a waveform as shown in FIG. 8a, and another input terminal coupled to a voltage supply $+V_4$. During horizontal trace, the inputs of ramp switch 94 are biased such that the negative polarity horizontal trace pulses cause ramp switch 94 to be nonconductive, allowing capacitor 95 to charge from the $+V_2$ supply through resistor 96. A fraction of the voltage on capacitor 95, determined by the values of resistors 101, 102 and 103, and 104, and having a waveform shown in FIG. 8b, therefore, appears at input 93 of comparator 88 as the waveform shown in FIG. 8c. During horizontal retrace, the positive horizontal retrace pulses at the input of ramp switch 94 causes ramp switch 94 to conduct, thereby placing junction 97 at ground potential and discharging capacitor 95. A fraction of this discharging ramp voltage determined by the values of resistors 101 and 102, appears at input 92 of comparator 87 as the waveform shown in FIG. 8d. The circuit components of modulator 40 are chosen to provide a large voltage offset between the inputs of comparators 87 and 88 in order to provide high pedestals for the trace and retrace ramp voltages. This prevents unwanted triggering of ITR's 25 and 26 due to wide error voltage swings.

The output of pulse-width modulator 40 comprises negative-going pulses which are width modulated based on the amount of overlap between the error voltage and retrace ramp at the inputs of comparator 87 and the amount of overlap between the error voltage and the trace ramp at the inputs of comparator 88. FIG. 9 illustrates the operation of modulator 40 with respect to the generation of the pulse width modulated pulses. The overlap between the retrace ramp shown in FIG. 9a and error voltage in FIG. 9b decreases during the vertical trace interval since the error voltage is decreasing and the retrace ramp sits at an average voltage level above the average error voltage. The amount of overlap determines the width of the output pulses of comparator 87, as seen in the waveform of FIG. 9c. The overlap between the trace ramp and the error voltage, and hence the width of the modulator pulses at the output of comparator 88, will increase during vertical trace as shown in FIG. 9f since the average voltage level of the trace ramp shown in FIG. 9e is below the error voltage, shown in FIG. 9d. The width of the modulator pulses (FIG. 9c) produced during the horizontal retrace interval will, therefore, steadily decrease during the vertical trace interval. The width of the modulator pulses produced during horizontal trace (FIG. 9f) on the other hand, will steadily increase during the vertical trace interval.

As previously described, the output pulses from modulator 40 are differentiated by capacitor 41, resistor 42, and the base-emitter diode of transistor 43. The differentiated pulses produce current pulses through transistor 43 which are applied to the gate terminals of SCR's 27 and 30. The gates of SCR's 27 and 30 float on the voltage across yoke winding 33. In order to trigger both SCR's 27 and 30 from a single gate drive source, the gate drive circuit must also float on top of the yoke voltage. Capacitor 49 charges via resistor 100 and acts as a supply battery for proper biasing of transistor 43 during its operation. The proper gate drive voltage is thereby maintained independent of the yoke voltage. Resistor 100 also acts as a yoke damping resistor.

Comparators 63, 87 and 88 and ramp switch 94 may be integrated as a single component. RCA CA 339E is an example of an integrated circuit which could be used for this purpose.

What is claimed is:

1. A vertical deflection circuit for use in a television receiver, comprising:
    first and second bidirectional switches, each comprising: a controllable switch element and a control terminal electrically connected thereto; said first and second bidirectional switches electrically connected in series with said controllable switch elements being coupled to conduct current in opposite directions through said switches;
    a source of horizontal deflection rate energy coupled to one end of said bidirectional switches;
    vertical deflection means including a vertical deflection coil coupled to the other end of said bidirectional switches; and
    a source of pulse-width modulated signals, coupled to said control terminals of said first and second bidirectional switches, for controlling the conductivity of said controllable switch elements in such a manner as to permit conduction of said horizontal rate energy through said first and second switches into said vertical deflection means for a predetermined duration of each vertical deflection interval.

2. The arrangement defined in claim 1, wherein each of said bidirectional switches comprises an SCR coupled in parallel with a diode.

3. The arrangement defined in claim 1, wherein the duration of said pulse-width modulated signals controls the conduction duration of said bidirectional switches, the conduction of said respective first and second bidirectional switches dependent upon the polarity of the voltage component of said horizontal rate energy.

4. The arrangement defined in claim 1, wherein said source of pulse-width modulated signals produces a first and second plurality of signal pulses, said first plurality of signal pulses progressively decreasing in duration during said vertical deflection interval, said second plurality of signal pulses progressively increasing in duration during said vertical deflection interval.

5. The arrangement defined in claim 4, wherein said first plurality of signal pulses controls the conduction of said first bidirectional switch, and said second plurality of signal pulses controls the conduction of said second bidirectional switch.

6. A vertical deflection circuit for use in a television receiver comprising:
    a vertical deflection coil;

a source of vertical deflection voltage comprising a capacitor having a first terminal at a first voltage level, and a second terminal at a reference potential level, said first terminal coupled to said vertical deflection coil;

switch means, incorporating first and second terminals, comprising: first and second bidirectional switches connected in series, each of said bidirectional switches having a controllable switch element and a control terminal coupled thereto, said switch means second terminal coupled to said capacitor first terminal;

a source of horizontal deflection rate energy coupled to said first terminal of said switch means; and a source of control pulses, the voltage level of which is referenced to said source of vertical deflection voltage, coupled to said control terminal of each of said switch means for controlling conduction of said first and second bidirectional switches for coupling said horizontal rate energy to said source of vertical deflection voltage.

7. The arrangement defined in claim 6, wherein said source of control pulses comprises output means having an output terminal and a reference terminal, said output terminal coupled to said control terminal of each of said switch means, said reference terminal coupled to said capacitor first terminal via a source of voltage potential.

8. The arrangement defined in claim 7, wherein said source of voltage potential comprises a capacitor.

9. A vertical deflection circuit for use in a television receiver, comprising:

vertical deflection means, including a vertical deflection coil, having first and second terminals, said first terminal coupled to a point of reference potential, said second terminal coupled to a point of floating voltage potential;

bidirectional switch means comprising first and second serially-connected bidirectional conducting switches, each of said switches having a control terminal, one end of said switch means coupled to said point of floating voltage potential;

a source of horizontal deflection rate energy coupled to the other end of said switch means; and a source of pulse-width modulated signals, the voltage level of which is referenced to said point of floating voltage potential, coupled to said control terminals of said switches for controlling conduction of said switches.

10. The arrangement defined in claim 9, wherein said source of pulse-width modulated signals comprises output means having an output terminal and a reference terminal, said output terminal coupled to said control terminal of each of said bidirectional switches, said reference terminal coupled to said point of floating voltage potential via a source of voltage potential.

11. The arrangement defined in claim 10, wherein said source of voltage potential comprises a capacitor.

* * * * *